US009125323B2

(12) United States Patent
Lee et al.

(10) Patent No.: US 9,125,323 B2
(45) Date of Patent: Sep. 1, 2015

(54) RACK BODY WITH AIRFLOW BLOCKING MECHANISM

(75) Inventors: Tung-Ping Lee, New Taipei (TW); Ming-Hui Kao, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 809 days.

(21) Appl. No.: 12/207,857

(22) Filed: Sep. 10, 2008

(65) Prior Publication Data

US 2011/0124278 A1    May 26, 2011

(30) Foreign Application Priority Data

Sep. 12, 2007    (TW) .............................. 096215337 A

(51) Int. Cl.
*H05K 7/20* (2006.01)
*G11B 33/12* (2006.01)
*G11B 33/14* (2006.01)

(52) U.S. Cl.
CPC .......... *H05K 7/20145* (2013.01); *G11B 33/124* (2013.01); *G11B 33/142* (2013.01)

(58) Field of Classification Search
CPC ....................................................... H05K 7/20
USPC ........... 454/184; 312/223.2; 361/695, 679.58, 361/679.33, 690
See application file for complete search history.

(56) References Cited

U.S. PATENT DOCUMENTS

| 5,877,938 | A | * | 3/1999 | Hobbs et al. ................... 361/724 |
| 5,927,386 | A | * | 7/1999 | Lin ................................ 165/80.3 |
| 6,052,281 | A | * | 4/2000 | Hardt et al. .................... 361/690 |
| 6,137,684 | A | * | 10/2000 | Ayd et al. ....................... 361/727 |
| 6,337,466 | B1 | * | 1/2002 | Chasen ......................... 219/405 |
| 6,483,107 | B1 | * | 11/2002 | Rabinovitz et al. ........... 250/239 |
| 6,511,139 | B2 | * | 1/2003 | Liu ............................. 312/223.2 |
| 6,535,382 | B2 | * | 3/2003 | Bishop et al. ................. 361/690 |
| 6,542,363 | B2 | * | 4/2003 | White ........................... 361/695 |
| 6,590,782 | B2 | * | 7/2003 | Fritz et al. ..................... 361/796 |
| 6,710,240 | B1 | * | 3/2004 | Chen et al. ................. 174/17 VA |
| 7,112,131 | B2 | * | 9/2006 | Rasmussen et al. ........... 454/184 |
| 7,344,439 | B2 | * | 3/2008 | Henry et al. .................. 454/184 |
| 7,656,660 | B2 | * | 2/2010 | Hoeft et al. ............... 361/679.51 |
| 2006/0103270 | A1 | * | 5/2006 | Bergesch et al. ........... 312/223.1 |
| 2007/0187126 | A1 | * | 8/2007 | Liang .............................. 174/50 |
| 2007/0207720 | A1 | * | 9/2007 | Henry et al. .................. 454/184 |

* cited by examiner

*Primary Examiner* — Steven B McAllister
*Assistant Examiner* — Samantha Miller

(57) ABSTRACT

A rear end of a main body of a rack body with an airflow blocking mechanism is pivotally coupled to a blocking sheet, and the blocking sheet is adjusted to be levelly or erectly disposed conveniently; the position change of the blocking sheet is relied on to control air to flow into a rack body or not to allow the rack body installed with no electronic device in the same computer housing to have an airflow blocking function to avoid decreasing air amount flowing through other rack bodies installed with an electronic device so as to elevate the electronic device cooling efficiency.

17 Claims, 2 Drawing Sheets

RACK BODY WITH AIRFLOW BLOCKING MECHANISM

BACKGROUND OF THE INVENTION

1. Field of the Invention

The present invention relates to a portable removable rack for an electronic device, and more particularly to a portable removable rack with an airflow blocking mechanism.

2. Description of Related Art

There are many patents, concerning a hard disk removable rack, for example, a hard disk rack structure disclosed by Taiwan Patent No. 572323 mainly comprises a rack body, hard disk rack and upper cover, in which a rear side of the hard disk rack is disposed with a engaging groove for allowing a receptacle of a connector without a bus line to be engaged therewith, one flank side thereof is disposed with a indentation zone for allowing a hard disk to be taken out conveniently, a front side thereof is respectively disposed with a cooling speed increasing fan and a movable front cover engaged therewith through upper and lower hooks, in which a labor-saving buckling and pushing handle is disposed in front of the cover, a projected-downward bump for pressing down a hard disk is disposed at the center of the upper cover, front and rear sides of the upper cover are respectively disposed with a groove and a projecting mass used for respectively engaging with a bump and a groove of the hard disk rack, and the rack body installed outside the hard disk rack is disposed with a movable dustproof cover on a front lower side thereof so as to attain to effects of increasing efficiency and elevating the use value of the product.

Furthermore, a removable hard disk rack structure disclosed in Taiwan Patent No. 534439 comprises a parent rack and a subsidiary rack, upper and lower side faces of the parent rack are hollow, a front side thereof is provided with a shielding plate capable of swinging inward and a rear side thereof is locked to a circuit board with a terminal. Furthermore, a front side of the subsidiary rack is provided with a fan and a rear side thereof is provided with another circuit board, in which a front side of the circuit board is provided with a bus line terminal and a power connection, and a rear side thereof is provided with another terminal to allow the two terminals to be inserted into each other when the subsidiary rack is inserted in the parent rack and the bus line terminal together with the power connection to be used for an insertion use when the hard disk main body is positioned inside the subsidiary rack. Besides, one side of the hard disk main body is reserved with screw holes and one side of the subsidiary rack is correspondingly disposed with through holes so as to allow the hard disk main body to be fixed by utilizing bolts to pass through to do screw connections to fix the hard disk main body.

Currently, several computer housings are respectively disposed with a plurality of accepting groove for accepting removable hard disk racks so as to allow a plurality of hard disks to be assembled therein. A front end of a general hard disk rack is provided with a multiple number of vent holes for allowing air to flow from a front side of the computer housing into the hard disk rack to cool the hard disk. When a certain hard disk rack is not installed with a hard disk, and other hard disk racks are respectively installed with a hard disk rack, air flowing into the plurality of hard disk racks from the front side of the computer housing is larger in the hard disk rack installed without the hard disk rack because there are no hard disk to block it but smaller in the hard disk rack installed with the hard disk such that the hard disk cooling efficiency is greatly decreased.

The rack body or the parent rack of the hard disk rack disclosed in the patents mentioned above is disposed with the dustproof cover or the shielding plate; there is also an airflow blocking effect when the dustproof cover or the shielding plate is erected; but, when an empty hard disk is placed in the accepting groove, the dustproof cover or the shielding plate then overturns onto a lower side of the hard disk rack and there is no airflow blocking effect.

SUMMARY OF THE INVENTION

For allowing a portable removable rack for an electronic device to have an airflow blocking effect as the electronic device is not installed therein, the present invention is proposed.

The main object of the present invention is to provide a rack body with an airflow blocking mechanism, capable of controlling air entering into the rack body to flow or not by changing a position of a blocking sheet.

Another object of the present invention is to provide a rack body with an airflow blocking mechanism, allowing the rack bodies installed without an electronic device in the same computer housing to have an airflow blocking function to avoid decreasing air flowing through other rack bodies installed with an electronic device so as to increase the cooling efficiency of the electronic devices.

For attaining to the objects mentioned above, the present invention proposes a rack body with an airflow blocking mechanism, capable of stopping air from flowing through the rack body as the rack body is empty, comprising: a main body, comprising a bottom plate; a front end, a first side end and a second side end of the bottom plate being respectively coupled to a front plate, a first side plate and a second side plate; vent holes being disposed on the front plate for allowing air to flow into the rack body; a blocking sheet, a bottom end thereof being pivotally coupled to the main body and placed at a rear end of the bottom plate; the blocking sheet being disposed with retaining units thereby allowing the blocking sheet to be erectly coupled to the main body to stop air from flowing through the rack body.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 1:
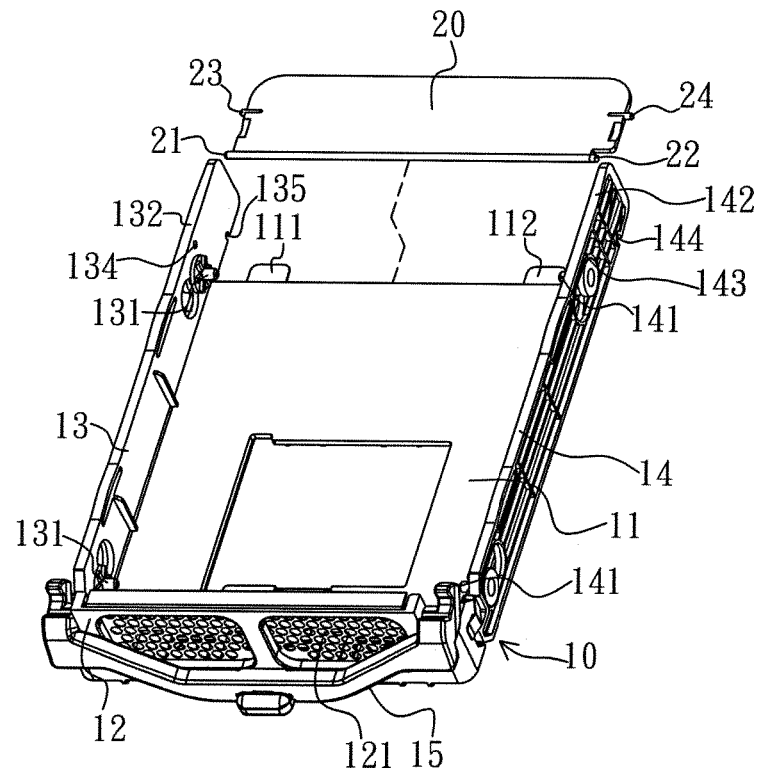
FIG. 1 is a perspective view, showing a main body and a blocking sheet not coupled to each other according to the present invention.
Figure 2:
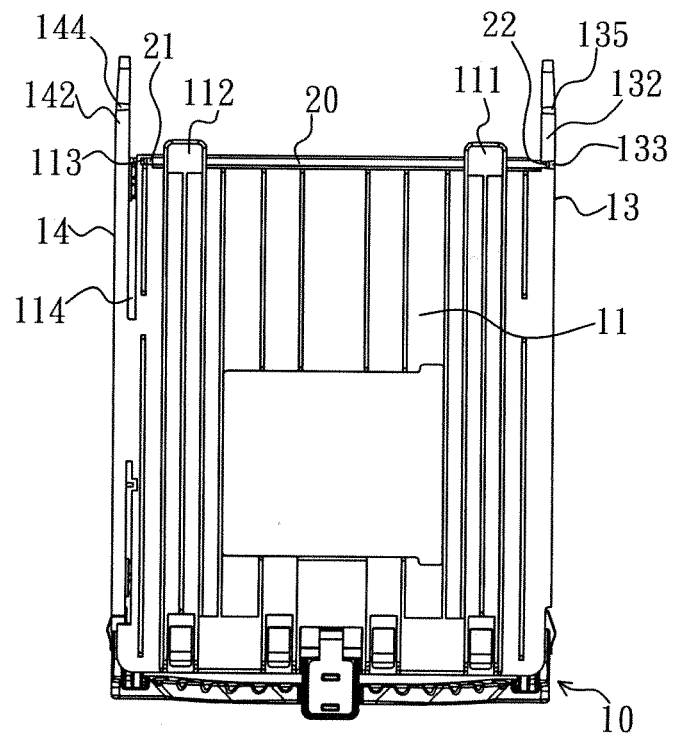
FIG. 2 is a perspective view, showing a first state of coupling a main body to a blocking sheet according to the present invention.
Figure 3:
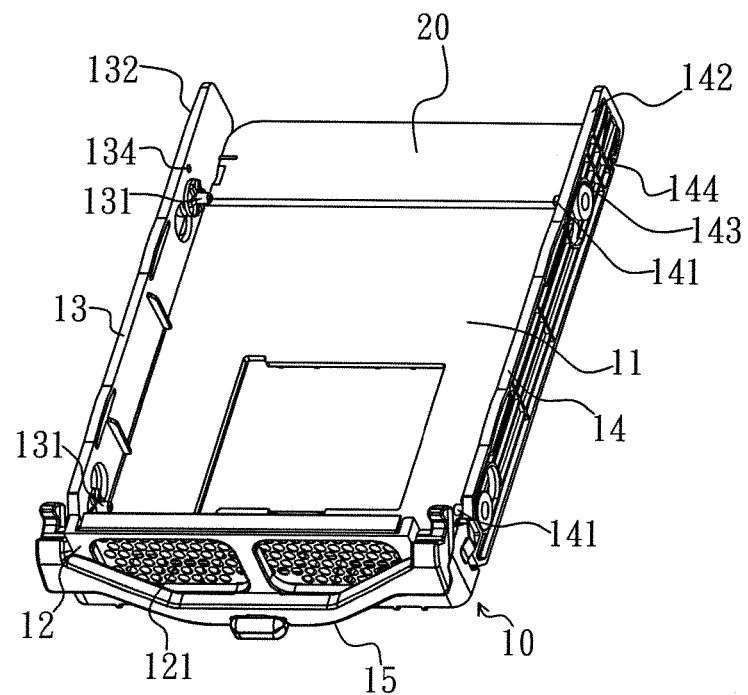
FIG. 3 is a top view, showing a main body and a blocking sheet coupled to each other according to the present invention.

Please refer to FIGS. 1, 2 and 3. A rack body with an airflow blocking mechanism according to the present invention can stop air from flowing through the rack body when the rack body is empty, the rack body with an airflow blocking mechanism comprises a main body 10 and a blocking sheet 20 used for coupling thereto.

The main body 10 comprises a bottom plate 11, a front plate 12, a first sideplate 13, a second side plate 14 and a handle 15, in which the front plate 12, the first side plate 13 and the second side plate 14 are respectively coupled to a front end, a first side end and a second side end of the bottom plate 11. Two ends of the handle 15 and two ends of the front plate 12 are respectively coupled to each other. The front plate 12 is provided with a multiple number of vent holes 121 for allowing outside air to flow into the rack body. Two positions of a rear end of the bottom plate 11 respectively close to the first side plate 13 and the second side plate 14 are respectively extended with tabs 111, 112; the rear end of the bottom plate 11 close to on side of the second side plate 13 is disposed with a first pivoting hole 113 as shown in FIG. 2. The first and the second side plates 13, 14 are respectively disposed with projected-inward pins 131, 141 allowed to insert in corresponding screw holes on an electronic device to fix the electronic device. The electronic device may be a media storing device such as hard disk drive or optical disk drive. The first and the second side plates 13, 14 are respectively disposed with first and second extension sections 132, 142 extended behind the bottom plate 11, in which at least one of the extension sections can be bended outward or both thereof can be bended outward to increase a distance between the first and the second side plates 13, 14.

A long slit 114 is further disposed between the rear end of the bottom plate 11 and a rear section of the second side plate 14 to allow the second extension section 142 of the second side plate 14 to have a larger bending amount. A bottom end of the first side plate 13 is disposed with a second pivoting hole 133 opposite to the first pivoting hole 113, a upper end of the first side plate 13 is disposed with a first positioning unit 134, for example, a positioning hole and the first positioning unit 134 is positioned above the second pivoting hole 133. A upper end of the second side plate 14 is disposed with a second positioning unit 143 opposite to the first positioning unit 134, for example, a positioning hole. Upper ends of the first and the second extension sections 132, 142 are respectively disposed with opposite third and fourth positioning units 135, 144, for example, positioning grooves.

Lower ends of first and second sides of the blocking sheet 20 are respectively disposed with opposite projected-outward first and second shafts 21, 22; upper ends of the first and the second sides of the blocking sheet 20 are respectively disposed with opposite projected-outward first and second retaining units 23, 24, for example, pins.

The first and the second pivoting holes 113, 133 are respectively engaged with the first and the second shafts 21, 22 to allow the lower end of the blocking sheet 20 to be pivotally coupled to the main body 10; the third and the fourth positioning units 135, 144 are respectively engaged with the first and the second retaining units 23, 24, and the tabs 111, 112 are positioned at the lower side of the blocking sheet 20 to support it to cause the blocking sheet 20 to be placed levelly behind the bottom plate 11 as shown in FIG. 3.

Figure 4:
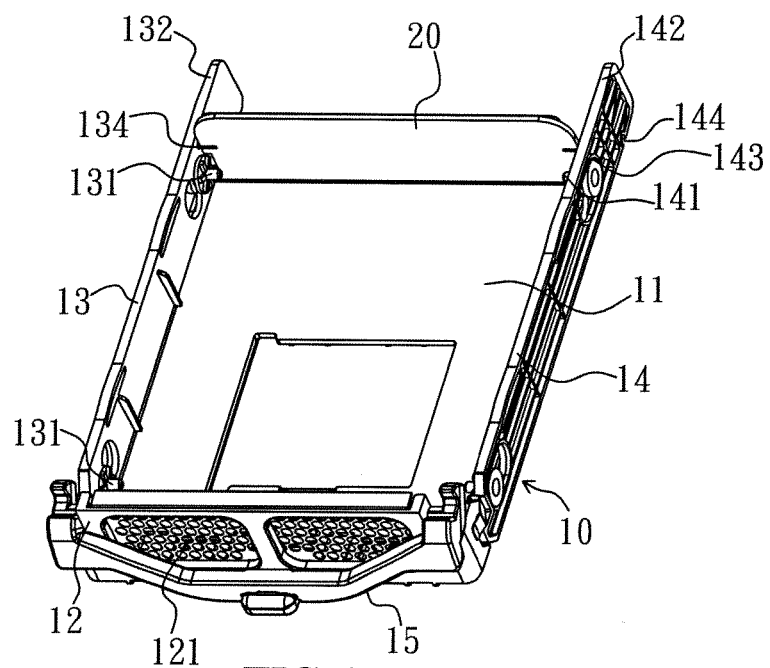
FIG. 4 is a perspective view, showing a second state of coupling a main body to a blocking sheet according to the present invention.

Please refer to FIGS. 1, 2 and 4. When there is no electronic device placed in the main body 10, a user may exert a force on the first and the second extension sections 132, 142 to cause at least one of the first and the second extension sections 132, 142 to be bended outward or both thereof to be respectively bended outward so as to enable the first and the second retaining units 23, 24 to be separated from the third and the fourth retaining units 135, 144. And then, the user may turn the blocking sheet over upward to cause it to be erectly disposed and allows the first and the second positioning units 134, 143 to be respectively engaged with the first and the second retaining units 23, 24 to enable the blocking sheet 20 to be erectly disposed behind the bottom plate 11. At this time, the blocking sheet 20 can stop air from flowing into the main body 10 through the vent holes 121 on the front plate 12 to enable the air not to flow through the rack body.

A rear end of a main body of the present invention is pivotally coupled to a blocking sheet, and the blocking sheet is adjusted to be levelly or erectly disposed conveniently; the position change of the blocking sheet is relied on to control air to flow into a rack body or not to allow the rack body installed with no electronic device in the same computer housing to have an airflow blocking function to avoid decreasing air amount flowing through other rack bodies installed with an electronic device so as to elevate the electronic device cooling efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A rack body with an airflow blocking mechanism, which is capable of stopping air from flowing through said rack body when said rack body is empty, comprising:

a main body with a bottom plate, a front plate, a first side plate, and a second side plate, wherein said bottom plate has a front end, a first side end, a second side end, and a rear end with the front end, the first side end, and the second side end being respectively coupled to the front plate, the first side plate, and the second side plate, and said front plate is disposed with vent holes for allowing air to flow into said rack body; and a blocking sheet with a bottom end and two opposite lateral ends being placed at the rear end of said bottom plate, wherein the bottom end is pivotally coupled to said main body, and the opposite lateral ends are disposed with a retaining unit respectively such that the blocking sheet is erectly coupled to said main body to stop air from flowing through said rack body or levelly coupled to said main body to admit air to flow through said rack body;

wherein a long slit is disposed between said second side plate and said bottom plate near the rear end of the bottom plate;

wherein the bottom plate is disposed with a first pivoting hole, and the first side plate is disposed with a second pivoting hole respectively; the bottom end of said blocking sheet is disposed with a first and second shafts corresponding to the first and second pivoting holes, and said first and second pivoting holes engage with said first and second shafts respectively;

wherein said first and second side plates are disposed with first and second extension sections extending behind said bottom plate respectively; at least one of the first and second extension sections or both the first and second extension sections are capable of being bended outward to increase a distance between the two side plates;

wherein an upper end of said main body is disposed with opposite first and second positioning units; said retaining units are first and second retaining units corresponding to said first and second positioning units; said first and second positioning units are respectively coupled to said first and second retaining units when said blocking sheet is erectly coupled to said main body; wherein each of said first and second positioning units is a positioning hole; each of said first and second retaining units is a pin.

2. The rack body with an airflow blocking mechanism according to claim 1, wherein said first pivoting hole is disposed at the rear end of the bottom plate close to the second side plate and said second pivoting hole is disposed at the first side plate opposite to the first pivoting hole.

3. The rack body with an airflow blocking mechanism according to claim 1, wherein the rear end of said bottom plate is disposed with at least one extended-rearward tab; said tab is placed under said blocking sheet to support said blocking sheet when said blocking sheet is levelly placed.

4. The rack body with an airflow blocking mechanism according to claim 1, wherein lower ends of the first and second extension sections are respectively disposed with third and fourth positioning units; said third and fourth positioning units are respectively coupled to said retaining units.

5. The rack body with an airflow blocking mechanism according to claim 4, wherein each of said third and fourth positioning units is a positioning groove.

6. The rack body with an airflow blocking mechanism according to claim 1, wherein the rear end of said bottom plate is disposed with at least one extended-rearward tab; said tab is placed under said blocking sheet to support said blocking sheet when said blocking sheet is levelly placed.

7. The rack body with an airflow blocking mechanism according to claim 6, wherein lower ends of said first and second extension sections are respectively disposed with third and fourth positioning units; said third and fourth positioning units are respectively coupled to said retaining units.

8. The rack body with an airflow blocking mechanism according to claim 7, wherein each of said third and fourth positioning units is a positioning groove.

9. The rack body with an airflow blocking mechanism according to claim 2, wherein the rear end of said bottom plate is disposed with at least one extended-rearward tab; said tab is placed under said blocking sheet to support said blocking sheet when said blocking sheet is levelly placed.

10. The rack body with an airflow blocking mechanism according to claim 9, wherein lower ends of said first and second extension sections are respectively disposed with third and fourth positioning units; said third and fourth positioning units are respectively coupled to said retaining units.

11. The rack body with an airflow blocking mechanism according to claim 10, wherein each of said third and fourth positioning units is a positioning groove.

12. The rack body with an airflow blocking mechanism according to claim 1, wherein the rear end of said bottom plate is disposed with at least one extended-rearward tab; said tab is placed under said blocking sheet to support said blocking sheet when said blocking sheet is levelly placed.

13. The rack body with an airflow blocking mechanism according to claim 12, wherein lower ends of said first and second extension sections are respectively disposed with third and fourth positioning units; said third and fourth positioning units are respectively coupled to said retaining units.

14. The rack body with an airflow blocking mechanism according to claim 13, wherein each of said third and fourth positioning units is a positioning groove.

15. The rack body with an airflow blocking mechanism according to claim 1, wherein the rear end of said bottom plate is disposed with at least one extended-rearward tab; said tab is placed under said blocking sheet to support said blocking sheet when said blocking sheet is levelly placed.

16. The rack body with an airflow blocking mechanism according to claim 15, wherein lower ends of said first and second extension sections are respectively disposed with third and fourth positioning units; said third and fourth positioning units are respectively coupled to said retaining units.

17. The rack body with an airflow blocking mechanism according to claim 16, wherein each of said third and fourth positioning units is a positioning groove.

\* \* \* \* \*